United States Patent [19]

Stahlhofen

[11] 4,404,272

[45] Sep. 13, 1983

[54] LIGHT-SENSITIVE MIXTURE AND COPYING MATERIAL PREPARED THEREFROM WITH NOVOLAK HAVING BROMINATED PHENOL UNITS

[75] Inventor: Paul Stahlhofen, Wiesbaden, Fed. Rep. of Germany

[73] Assignee: Hoechst Aktiengesellschaft, Frankfurt, Fed. Rep. of Germany

[21] Appl. No.: 351,479

[22] Filed: Feb. 23, 1982

[30] Foreign Application Priority Data

Feb. 26, 1981 [DE] Fed. Rep. of Germany ....... 3107109

[51] Int. Cl.³ .......................... G03C 1/60; G03C 1/68; G03C 1/70; G03C 1/727
[52] U.S. Cl. .................... 430/192; 430/175; 430/176; 430/189; 430/191; 430/270; 430/330; 430/907
[58] Field of Search ............... 430/192, 190, 175, 176, 430/270, 286, 191, 193, 907

[56] References Cited

U.S. PATENT DOCUMENTS

| | | |
|---|---|---|
| 3,050,387 | 8/1962 | Neugebauer et al. |
| 3,130,048 | 4/1964 | Fritz et al. ........................ 430/193 |
| 3,396,019 | 8/1968 | Uhlig .................................. 430/175 |
| 3,647,443 | 3/1972 | Rauner et al. ..................... 430/192 |
| 4,123,279 | 10/1978 | Kobayashi ........................ 430/192 |
| 4,247,611 | 1/1981 | Sander et al. ..................... 430/192 |
| 4,250,247 | 2/1981 | Sander et al. ..................... 430/270 |
| 4,266,000 | 5/1981 | Stahlhofen et al. ............... 430/192 |
| 4,306,011 | 12/1981 | Uehara et al. ..................... 430/190 |
| 4,336,319 | 6/1982 | Nagashima et al. ............... 430/190 |

FOREIGN PATENT DOCUMENTS

| | | | |
|---|---|---|---|
| 1561438 | 2/1980 | United Kingdom | ............... 430/191 |
| 213576 | 5/1968 | U.S.S.R. | ............................. 430/190 |

*Primary Examiner*—Charles L. Bowers, Jr.
*Attorney, Agent, or Firm*—James E. Bryan

[57] ABSTRACT

A light-sensitive mixture, which is composed of a light-sensitive compound, for example, an o-quinone-diazide or a diazonium salt polycondensate, or a light-sensitive combination of compounds, for example, a photolytic acid donor and an acetal compound or orthocarboxylic acid compound which can be cleaved by acid, and of a novolak having halogenated phenol units is described. The mixture is preferably used for the preparation of printing plates, in particular planographic printing plates, which have an improved resistance to aqueous-alkaline developer solutions, gasoline hydrocarbons and fountain solutions containing alcohol.

4 Claims, No Drawings

LIGHT-SENSITIVE MIXTURE AND COPYING MATERIAL PREPARED THEREFROM WITH NOVOLAK HAVING BROMINATED PHENOL UNITS

The invention relates to a light-sensitive mixture composed of a light-sensitive compound, or of a light-sensitive combination of compounds, which changes its solubility in an aqueous-alkaline solution upon exposure, and a novolak, and to a light-sensitive copying material comprising a support and a light-sensitive layer composed of the aforementioned mixture.

Mixtures of the generic type stated, which contain positive-working o-quinone-diazides as the light-sensitive compounds and which are preferably used for the preparation of printing plates, are known, for example, from German Pat. No. 1,195,166 (equivalent to U.S. Pat. No. 3,201,239). These known mixtures contain phenol/formaldehyde or cresol/formaldehyde novolaks.

German Offenlegungsschrift No. 2,512,933 discloses a similar mixture which, however, contains a novolak resin obtained from an alkylphenol with an alkyl group having 3–15 carbon atoms, or from a cycloalkylphenol. The alkylphenol can be further substituted by halogen atoms, but an illustrative example of a halogen-substituted alkylphenol is not given. The novolaks obtained from the substituted phenols are said to lead to an improved oleophilic character of the image areas of planographic printing plates and, consequently, to a longer printing run. They have the disadvantage, however, that light-sensitive layers, prepared with these novolaks, can be developed only with developer solutions which contain organic solvents, for example benzyl alcohol. For this reason, these resins are, in general, used only in combination with the conventional phenol/formaldehyde or cresol/formaldehyde novolaks and preferably in a quantity of 1–20 percent by weight, relative to the total mixture. Positive-working mixtures of compounds, which release an acid on exposure, and compounds which can be cleaved by acid, for example acetals and ortho-carboxylic acid esters, which mixtures contain major quantitative proportions of novolaks, are also known. Mixtures of this type are described, for example, in U.S. Pat. Nos. 4,101,323 and 4,247,611, and in German Offenlegungsschrift No. 2,928,636.

Furthermore, mixtures of diazonium salt condensation products and novolaks are known, for example from U.S. Pat. No. 3,867,147, Examples 54 and 61.

Planographic printing forms which have been prepared from light-sensitive planographic printing plates based on such mixtures containing a novolak, are distinguished by long printing runs. The printing stencil of such printing forms, however, shows a certain sensitivity to fountain solutions containing alcohol, such as are frequently used at present. This has the consequence that the printing stencil is attacked and the printing run is shortened. The resistance to aqueous-alkaline developer solutions and to gasoline solvents, such as are used during the copying work or on the printing machines, is in some cases also inadequate.

Although the resistance of such printing stencils can be increased by baking at temperatures above 180° C., this additional working step in every case also requires a pretreatment or after-treatment of the printing form and hence a certain labor effort.

It is the object of the invention to provide a light-sensitive mixture, in particular for the preparation of planographic printing plates, which has the advantages of the known mixtures and additionally has a higher resistance to gasoline solvents, alkaline developer solutions, and fountain solutions containing alcohol.

According to the invention, a light-sensitive mixture composed of a light-sensitive compound, or a light-sensitive combination of compounds, the solubility of which in an aqueous-alkaline solution changes upon exposure, and a novolak is provided, wherein the novolak contains halogenated phenol units.

As the halogen substituents, chlorine atoms and bromine atoms are preferred. In general, the halogen content of the novolaks may be about 10 to 50 percent by weight; the chlorine content may be about 10 to 30 percent by weight and the bromine content may be about 15 to 50 percent by weight.

The new novolak resins may contain 1 to 3 halogen atoms, and preferably not more than 1 halogen atom, in one phenol nucleus. The halogen atoms are preferably in the m-position or p-position relative to the OH group. The novolaks may contain halogenated and non-halogenated units. In addition to the halogen atoms, the phenol units may contain lower alkyl groups as substituents, i.e., methyl or ethyl groups, preferably methyl groups, which also are preferably in the m-position or p-position. The mean molecular weight of the resins is about 800 to 5,000.

The new halogenated novolaks can be prepared by a condensation reaction of halogenophenols with formaldehyde, in the same way as the known novolaks. The condensation reaction is advantageously carried out in organic solvents, such as ethanol, methoxy- or ethoxyethyl acetate, dioxane or chlorobenzene, in the presence of acid condensing agents, such as hydrochloric acid or oxalic acid, at a temperature in the range from 80° to 130° C. Depending on the temperature, the reaction time can be about ½ to 4 hours.

The halogenophenols can also be employed in the condensation reaction as a mixture with halogen-free phenols or alkylphenols.

Advantageously, the halogenated novolaks also can be prepared by subsequent halogenation of halogen-free novolaks, for example commercially available phenol novolaks or cresol novolaks. The halogenation, preferably chlorination or bromination, is appropriately carried out in glacial acetic acid at room temperature or at an elevated temperature, for example between 60° and 100° C.

The concentration of the halogenated novolaks in the light-sensitive mixture can vary widely, depending upon the nature of the light-sensitive system. In general, the proportion is between 10 and 95 percent by weight, preferably about 20 to 80 percent by weight, relative to the weight of the non-volatile constituents of the light-sensitive mixture.

As an essential constituent, the mixture according to the invention contains a light-sensitive compound, or a light-sensitive combination of compounds, the solubility of which in an aqueous-alkaline developer solution changes upon exposure. Suitable negative-working compounds are diazonium salt polycondensation products and p-quinone-diazides. Positive-working systems are preferred, i.e., those the solubility of which is increased by exposure. These systems include, above all, o-quinone-diazides and combinations of photolytic acid donors with compounds which can be cleaved by acid.

The preferred o-quinone-diazides are 1,2-naphthoquinone-2-diazide-4 or 5-sulfonic acid esters or amides. Among these, the esters, especially those of the 5-sulfonic acids, are particularly preferred. Suitable compounds of this type are known and have been described, for example, in German Pat. No. 938,233 and in German Offenlegungsschriften Nos. 2,331,377, 2,547,905, and 2,828,037. The quantity of o-quinone-diazide compounds is in general 3 to 50 percent by weight, preferably 7 to 35 percent by weight, relative to the non-volatile constituents of the mixture.

Materials based on compounds which can be cleaved by acid also can be very effectively used in the mixture according to the invention.

Copying materials of this type are known and have been described, for example, in U.S. Pat. Nos. 3,779,778 and 4,101,323, German Pat. No. 2,718,254, and German Offenlegungsschriften Nos. 2,829,512, 2,829,511, and 2,928,636. As the compounds which can be cleaved by acid, these materials contain ortho-carboxylic acid derivatives, monomeric or polymeric acetals, enol ethers or acyliminocarbonates. As the radiation-sensitive compounds which release an acid, they predominantly contain organic halogen compounds, in particular s-triazines which are substituted by halogenomethyl groups.

Among the ortho-carboxylic acid derivatives described in U.S. Pat. No. 4,101,323, in particular the diphenoxy-methyl ethers of aliphatic or aromatic hydroxy compounds, the N-diphenoxymethyl derivatives of lactams and very particularly the bis-1,3-dioxan-2-yl ethers of aliphatic diols are employed.

Among the polyacetals described in German Pat. No. 2,718,254, those having aliphatic aldehyde and diol units are preferred.

Among the polymeric ortho-esters described in German Offenlegungsschrift No. 2,928,636, polymers having recurring 1,3-dioxa-cyclohex-2-yl alkyl ether units, in which the alkyl ether group can be interrupted by ether oxygen atoms and is preferably bonded to the 5-position of the adjacent ring, are particularly preferred.

The quantitative proportion of the compounds, which can be cleaved by acid, in the light-sensitive mixture is in general between 8 and 65 percent by weight, preferably between 14 and 44 percent by weight, relative to the non-volatile constituents of the mixture. The quantity of the compound which releases an acid is between 0.1 and 10 percent by weight, preferably between 0.2 and 5 percent by weight.

Suitable p-quinone-diazides are described, for example, in German Pat. No. 1,104,824 (equivalent to U.S. Pat. No. 3,180,732). The diazonium salt polycondensation products used are condensation products of aromatic diazonium salts and carbonyl compounds, preferably formaldehyde. Suitable condensation products have been described in German Pat. No. 1,214,086 (equivalent to U.S. Pat. No. 3,235,384). Those condensation products are preferred which, in addition to the diazonium salt units, also contain units of other compounds which are capable of condensation with formaldehyde and are free from diazonium groups, for example units of aromatic amines, phenols, phenol ethers, aromatic thioethers, aromatic hydrocarbons, aromatic heterocyclic compounds and organic acid amides, such as are described in German Offenlegungsschrift No. 2,024,244 (equivalent to U.S. Pat. No. 3,867,147).

In addition to the halogenated novolaks, the mixtures according to the invention also may contain additional binders which are insoluble in water and soluble in aqueous-alkaline solutions, preferably the halogen-free novolaks which are known and are conventional for this purpose. In this case, 0 to 80 percent by weight, preferably 0 to 70 percent by weight, of the quantity of halogenated novolak can be replaced by non-halogenated novolak, without losing the improved resistance of the layer to alkali and solvents. The total quantity of novolak should be within the range of the limits indicated above for the halogenated novolak.

In addition, numerous other resins also can be used, preferably vinyl polymers, such as polyvinyl acetates, polyacrylates, polyvinyl ethers, polyvinylpyrrolidones, and the copolymers of the monomers on which the former are based. The most advantageous proportion of these resins depends upon the technological requirements and on the influence on the developing conditions, and in general is not more than 20 percent by weight of the alkali-soluble resin. For special requirements, such as flexibility, adhesion, gloss, coloration and color change, and the like, the light-sensitive mixture may additionally contain small quantities of substances, such as polyglycols, cellulose derivatives such as ethylcellulose, wetting agents, dyes, adhesion-promoters and finely divided pigments as well as, if required, UV absorbers.

The addition of particular hot-curable hydroxymethylphenol derivatives, as described in German Offenlegungsschrift No. 3,039,926, has proved to be particularly advantageous. In the presence of halogenated novolaks as the binders, copying layers of this type have substantially improved adhesion to the substrate and improved resistance to alcohol and developer, as compared with the adhesion and resistance achieved with the corresponding non-halogenated novolaks.

The hydroxymethylphenols can, for example, correspond to one of the general formulae I and II

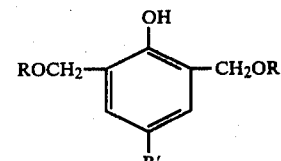

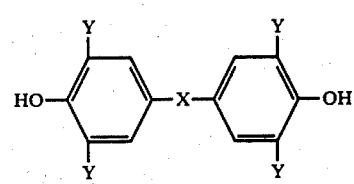

in which
R is a hydrogen atom, a lower alkyl group, or a lower acyl group, preferably a hydrogen atom,
R' is an alkyl, alkoxy, cycloalkyl, aryl, aryloxy, acyl or aralkyl group or a halogen atom, X is a single bond or one of the groups S, O, CO or $CR^1R^2$, preferably a prop-2,2-ylene group, and Y is a hydrogen atom or, preferably, a $CH_2OH$ group, $R^1$ and $R^2$ being identical or different and representing hydrogen atoms or substituted or unsubstituted alkyl groups which can be linked to one another to form a ring, and not more than two of the substituents Y being hydrogen atoms.

For coating a suitable support, the mixtures are, in general, dissolved in a solvent. The selection of the solvents must be matched to the intended coating process, the layer thickness and the drying conditions. Suitable solvents for the mixture according to the invention are ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl ether, and esters, such as butyl acetate. It is also possible to use mixtures which, for special purposes, may additionally contain solvents, such as acetonitrile, dioxane or dimethylformamide. In principle, all those solvents can be used which do not irreversibly react with the components of the layer.

In most cases, metals are used as the supports for layer thicknesses of less than about 10 μm. The following can be used for offset printing plates: bright-rolled, mechanically or electrochemically roughened and, if appropriate, anodized aluminum which may additionally have been chemically pretreated, for example with polyvinylphosphonic acid, silicates, hexafluorozirconates, hydrolyzed tetraethyl orthosilicate or phosphates.

The coating of the support is effected in known manner by spin-coating, spraying, dipping, rolling, by means of slot dies, doctor blades or by coater application.

The light sources customary in industry are used for exposure. Irradiation with electrons or a laser is another possibility for providing the image.

In the case of positive-working mixtures, the aqueous-alkaline solutions which are used for development and have a stepped alkalinity, i.e., a pH preferably between 10 and 14, and which may also contain minor amounts of organic solvents or wetting agents, remove those areas of the copying layer which have been struck by light, and thus produce a positive image of the original. In the case of negative-working mixtures, developers of the same type or those having pH values in the neutral range remove the unexposed areas.

The preferred use of the light-sensitive mixtures according to the invention is in the preparation of printing forms, in particular offset printing forms, the supports being metals, in particular aluminum.

After development, the printing form can be heated in known manner. If the hydroxymethylphenols defined above have been added, it is possible to achieve the desired lengthening of the printing run at relatively low temperatures or within relatively short times. The baking temperatures selected can be in the range from about 150° to 240° C., preferably from 160° to 210° C., heating times of 1–20, preferably 5 to 15 minutes, being normally required. If the support material is resistant to higher temperatures, it is of course also possible to carry out the baking at higher temperatures above 240° C. and to select correspondingly short heating periods.

The copying materials prepared with the use of the halogenated novolaks have an improved resistance to alkaline developers and chemicals, in particular solvents containing alcohol and gasoline, such as are customarily used during copying work or during the printing process on the printing machines. They also have good compatibility with the remaining constituents of the copying layer.

The invention is explained in more detail by reference to the examples which follow, wherein parts by weight (p.b.w.) and parts by volume (p.b.v.) have the same relationship as the g and the ml. Unless otherwise stated, percentages are percent by weight.

EXAMPLE 1

An electrolytically roughened and anodized aluminum plate having an oxide weight of 3.0 g/m$^2$ was coated with a solution of 1.00 part by weight of the esterification product obtained from 1 mole of 2,3,4-trihydroxy-benzophenone and 2 moles of 1,2-naphthoquinone-2-diazide-5-sulfonic acid chloride,
0.14 part by weight of 1,2-naphthoquinone-2-diazide-4-sulfonic acid chloride,
2.50 parts by weight of a brominated cresol/formaldehyde novolak having a softening point of 95°–110° C. and a bromine content of 39.0 percent by weight,
3.50 parts by weight of a non-halogenated cresol/formaldehyde novolak having a softening point of 105°–120° C., and
0.06 part by weight of crystal violet in
40.00 parts by weight of ethylene glycol monomethyl ether and
50.00 parts by weight of tetrahydrofuran.

Before the light-sensitive copying layer was applied, the anodized aluminum support had been treated with an aqueous solution of polyvinylphosphonic acid, as described in German Pat. No. 1,621,478.

The presensitized material thus prepared and having a layer weight of the light-sensitive layer of 2.00 g/m$^2$ was exposed imagewise under a transparent positive original and was then developed with the following solution:

5.3 parts by weight of sodium metasilicate×9 water,
3.4 parts by weight of trisodium phosphate×12 water,
0.3 part by weight of sodium dihydrogen phosphate (anhydrous) in
91.0 parts by weight of water.

As a result of the development, those parts of the copying layer which had been struck by light were removed, and the unexposed image areas remained on the support. About 200,000 perfect prints were produced on an offset press from the printing form thus prepared.

The printing stencil was distinguished by an excellent resistance to developer and good adhesion to the support. The resistance of the copying layer to chemicals, for example to acid fountain solutions containing alcohol or to wash-out solutions containing gasoline, such as are customarily used during the printing process on the printing machines, was also remarkably good.

The improved properties of the copying layer are ascribed to the presence of the halogenated novolak in the layer. When the proportion of the brominated novolak indicated in Example 1 was replaced with the same quantity of the corresponding non-halogenated novolak with otherwise the same composition, the printing stencil obtained after exposure and development was already strongly attacked after two minutes' action of the developer and was almost completely detached from the support after five minutes' action. In contrast thereto, the printing stencil prepared according to Example 1 was not yet attacked even after five minutes' action of the developer.

Similar results were obtained when the copying layer which was prepared according to Example 1 and which contained the halogenated novolak resin, was treated with an acidic, aqueous-alcoholic solution composed of, for example, 50 percent by weight of isopropanol, 1 percent by weight of phosphoric acid and 49 percent by weight of water. Upon mechanical rubbing with a dabber impregnated with this solution, the copying layer according to Example 1 remained unchanged even after one minute, while the corresponding copying layer with the non-halogenated novolak was already damaged after 30 seconds. The corresponding copying layers gave similarly differing results when treated under the same experimental conditions with gasoline (boiling range 80°–110° C.).

In the examples which follow, further coating solutions are indicated, similar results being obtained. Unless specially noted, the preparation and processing of the printing plates thus obtained correspond to the conditions described in Example 1.

EXAMPLE 2

An aluminum plate treated as in Example 1 was coated with a solution of 1.50 parts by weight of the esterification product obtained from 1 mole of 2,3,4-trihydroxy-benzophenone and 2 moles of 1,2-naphthoquinone-2-diazide-5-sulfonic acid chloride,
2.50 parts by weight of a brominated phenol/formaldehyde novolak having a melting range of 110°–125° C. and a bromine content of 39.1 percent by weight,
4.00 parts by weight of a brominated cresol/formaldehyde novolak having a melting range of 90°–110° C. and a bromine content of 38.9 percent by weight,
0.14 part by weight of 1,2-naphthoquinone-2-diazide-4-sulfonic acid chloride, and
0.06 part by weight of crystal violet in
40.00 parts by weight of ethylene glycol monomethyl ether and
50.00 parts by weight of tetrahydrofuran.

The light-sensitive printing plate thus prepared was exposed imagewise under a transparent positive original and developed with the solution indicated in Example 1.

EXAMPLE 3

An aluminum plate treated as in Example 1 was coated with a solution of 1.00 part by weight of the esterification product obtained from 1 mole of 2,4-dihydroxy-benzophenone and 2 moles of 1,2-naphthoquinone-2-diazide-5-sulfonic acid chloride,
3.00 parts by weight of a chlorinated phenol/formaldehyde novolak which had been obtained from p-chlorophenol by boiling for 4 hours with formaldehyde (in the form of a 37 percent aqueous solution) in the presence of hydrochloric acid as the condensing agent,
0.14 part by weight of 1,2-naphthoquinone-2-diazide-4-sulfonic acid chloride, and
0.06 part by weight of crystal violet in
30.00 parts by weight of ethylene glycol monomethyl ether and
40.00 parts by weight of tetrahydrofuran.

The light-sensitive printing plate thus prepared was exposed imagewise under a transparent positive original and developed with the solution indicated in Example 1.

EXAMPLE 4

An aluminum plate pretreated as in Example 1 was coated with a solution of 1.00 part by weight of the esterification product obtained from 1 mole of 2,3,4-trihydroxy-benzophenone and 3 moles of 1,2-naphthoquinone-2-diazide-5-sulfonic acid chloride,
2.00 parts by weight of a brominated cresol/formaldehyde novolak having a softening point of 90°–110° C. and a bromine content of 38.9 percent by weight,
0.12 part by weight of 4-(p-tolylmercapto)-2,5-diethoxybenzene-diazonium hexafluorophosphate,
1.30 parts by weight of 2,2-bis-(4-hydroxy-3,5-dihydroxymethyl-phenyl)-propane,
3.00 parts by weight of a cresol/formaldehyde novolak having a softening point of 105°–120° C., and
0.06 part by weight of crystal violet in
40.00 parts by weight of ethylene glycol monomethyl ether and
50.00 parts by weight of tetrahydrofuran.

The light-sensitive printing plate thus prepared was exposed imagewise under a transparent positive original and developed with the solution indicated in Example 1.

EXAMPLE 5

An aluminum plate pretreated as in Example 1 was coated with a solution of 1.00 part by weight of the condensation product obtained from 1 mole of 3-methoxy-diphenylamine-diazonium sulfate and 1 mole of 4,4'-bis-methoxymethyldiphenyl ether,
1.00 part by weight of a brominated phenol/formaldehyde novolak having a softening point of 110°–125° C. and a bromine content of 39 percent by weight,
2.50 parts by weight of a non-halogenated phenol/formaldehyde novolak having a softening point of 83°–88° C.,
0.05 part by weight of Metanil Yellow (C.I. 13,065),
0.05 part by weight of Victoria Pure Blue FGA (C.I. Basic Blue 81), and
0.10 part by weight of phosphoric acid (85 percent) in
45.00 parts by weight of ethylene glycol monomethyl ether.

The light-sensitive printing plate thus prepared was exposed imagewise under a transparent negative original and developed with the solution indicated in Example 1.

EXAMPLE 6

An aluminum plate pretreated as in Example 1 was coated with a solution of 2.80 parts by weight of a 50 percent solution of a polyorthoester in toluene, prepared from 7,7-bis-hydroxymethyl-5-oxa-nonan-1-ol and trimethyl orthoformate,
0.24 part by weight of 2,4-bis-(trichloromethyl)-6-(4-ethoxy-naphth-1-yl)-s-triazine,
1.30 parts by weight of a brominated phenol/formaldehyde novolak having a softening point of 110°–125° C. and a bromine content of 46 percent by weight, 3.30 parts by weight of a brominated cresol/formaldehyde novolak having a softening point of 95°–110° C. and a bromine content of 46.3 percent by weight and 0.05 part by weight of crystal violet in
80.00 parts by weight of methyl ethyl ketone.

The printing plate thus prepared was exposed imagewise for 10 seconds under a 5 kW metal halide lamp at a distance of 110 cm and was then developed as in Example 1.

It will be obvious to those skilled in the art that many modifications may be made within the scope of the present invention without departing from the spirit thereof, and the invention includes all such modifications.

What is claimed is:

1. A light-sensitive mixture comprising, as the light-sensitive compound, an o-quinone-diazide or, as a light-sensitive combination of compounds, a mixture of
   (a) a compound which releases an acid on exposure, and
   (b) a compound containing at least one C—O—C group which can be cleaved by an acid,
the solubility of which mixture in an aqueous-alkaline solution is increased upon exposure, and a novolak containing brominated phenol units wherein the brominated novolak contains about 15 to 50 percent by weight of bromine.

2. A light-sensitive copying material comprising a support and a light-sensitive layer thereon which contains, as the light-sensitive compound, an o-quinone-diazide or, as a light-sensitive combination of compounds, a mixture of
   (a) a compound which releases an acid on exposure, and
   (b) a compound containing at least one C—O—C group which can be cleaved by an acid,
the solubility of which mixture in an aqueous-alkaline solution is increased upon exposure, and a novolak containing brominated phenol units wherein the brominated novolak contains about 15 to 50 percent by weight of bromine.

3. A light-sensitive mixture as claimed in claim 1 which additionally contains a resin which is insoluble in water and soluble in aqueous-alkaline solutions and which is not a brominated novolak.

4. A light-sensitive mixture as claimed in claim 1 which additionally contains a thermosetting hydroxymethylphenol derivative.

* * * * *